US008283554B2

(12) United States Patent
Bruning et al.

(10) Patent No.: US 8,283,554 B2
(45) Date of Patent: Oct. 9, 2012

(54) METHOD AND APPARATUS FOR CONCENTRATING LIGHT

(75) Inventors: John H Bruning, Pittsford, NY (US); Joshua Monroe Cobb, Victor, NY (US); Paul Francis Michaloski, Rochester, NY (US)

(73) Assignee: Corning Incorporated, Corning, NY (US)

(*) Notice: Subject to any disclaimer, the term of this patent is extended or adjusted under 35 U.S.C. 154(b) by 829 days.

(21) Appl. No.: 11/605,639

(22) Filed: Nov. 29, 2006

(65) Prior Publication Data
US 2007/0137690 A1   Jun. 21, 2007

Related U.S. Application Data

(60) Provisional application No. 60/751,810, filed on Dec. 19, 2005.

(51) Int. Cl.
*H01L 31/042* (2006.01)
*G02B 27/14* (2006.01)

(52) U.S. Cl. ........ 136/246; 359/629; 359/631; 359/633; 359/634

(58) Field of Classification Search ................. 136/246; 359/629, 631, 633, 634
See application file for complete search history.

(56) References Cited

U.S. PATENT DOCUMENTS

| | | | |
|---|---|---|---|
| 4,058,110 A * | 11/1977 | Holt | 126/699 |
| 4,223,174 A * | 9/1980 | Moeller | 136/246 |
| 4,367,367 A * | 1/1983 | Reisfeld et al. | 136/247 |
| 5,005,958 A | 4/1991 | Winston et al. | 350/442 |
| 5,062,899 A | 11/1991 | Kruer | 136/259 |
| 5,365,920 A | 11/1994 | Lechner | 126/696 |
| 5,979,439 A | 11/1999 | Hoffschmidt et al. | 126/693 |
| 6,020,553 A | 2/2000 | Yogev | 136/246 |
| 6,407,974 B1 | 6/2002 | Kim et al. | 369/112.29 |
| 6,668,820 B2 | 12/2003 | Cohen et al. | 126/685 |
| 6,818,818 B2 | 11/2004 | Bareis | 136/246 |
| 2001/0011551 A1 | 8/2001 | Peumans et al. | 136/246 |
| 2003/0016539 A1 | 1/2003 | Minano et al. | 362/347 |
| 2005/0046977 A1* | 3/2005 | Shifman | 359/853 |
| 2005/0051205 A1* | 3/2005 | Mook, Jr. | 136/255 |

OTHER PUBLICATIONS

Yehezkel et al., Photovoltaic conversion in a commmon solar concentrating and spectrally splitting system, IEE, Dec. 1994.*
XP010822819; "Toward 40% and Higher Solar Cells in a New Cassegrainian PV Module"; Fraas, et al; 0-7803-8707-4/05; 2005 IEEE; p. 751-753. "Planar Concentrators Near the Etendue Limit" by Roland Winston and Jeffrey M. Gordon in *Optics Letters*, vol. 30 No. 19, pp. 2617-2619, Oct. 2005.
"New Cassegrainian PV Module using Dichroic Secondary and Multijunction Solar Cells" presented at an International Conference on Solar Concentration for the Generation of Electricity or Hydrogen in May 2005 by L. Fraas, J. Avery, H. Huang, and E. Shifman.

* cited by examiner

*Primary Examiner* — Basia Ridley
*Assistant Examiner* — Devina Pillay
(74) *Attorney, Agent, or Firm* — Tina N. Thompson; Matthew B. McNutt; Timothy M. Schaeberle

(57) ABSTRACT

An apparatus for obtaining radiant energy has first and second photovoltaic receivers. A primary curved reflective surface is disposed to reflect incident polychromatic radiation toward a first focal plane. A spectral separator is disposed between the first focal plane and the primary curved reflective surface. The spectral separator has a dichroic separating surface, convex with respect to the incident reflected polychromatic radiation and treated to reflect a first spectral band toward the first photovoltaic receiver and to transmit reflected polychromatic radiation outside the first spectral band. The spectral separator also has a curved separator reflective surface, convex with respect to the light transmitted through the dichroic separating surface and treated to reflect at least a portion of the light transmitted through the dichroic separating surface toward the second photovoltaic receiver.

7 Claims, 22 Drawing Sheets

SIDE

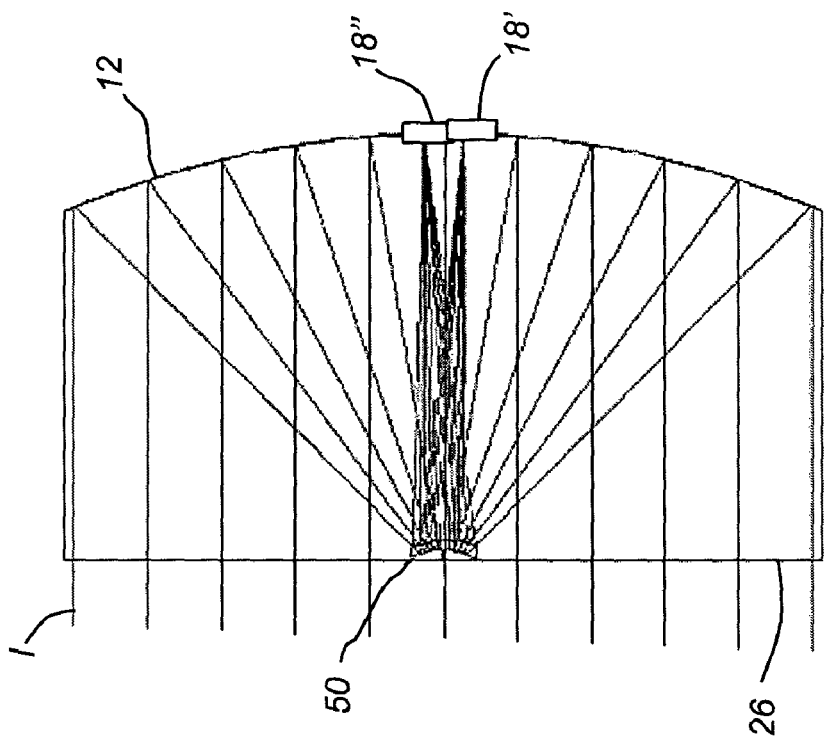
*FIGURE 8*

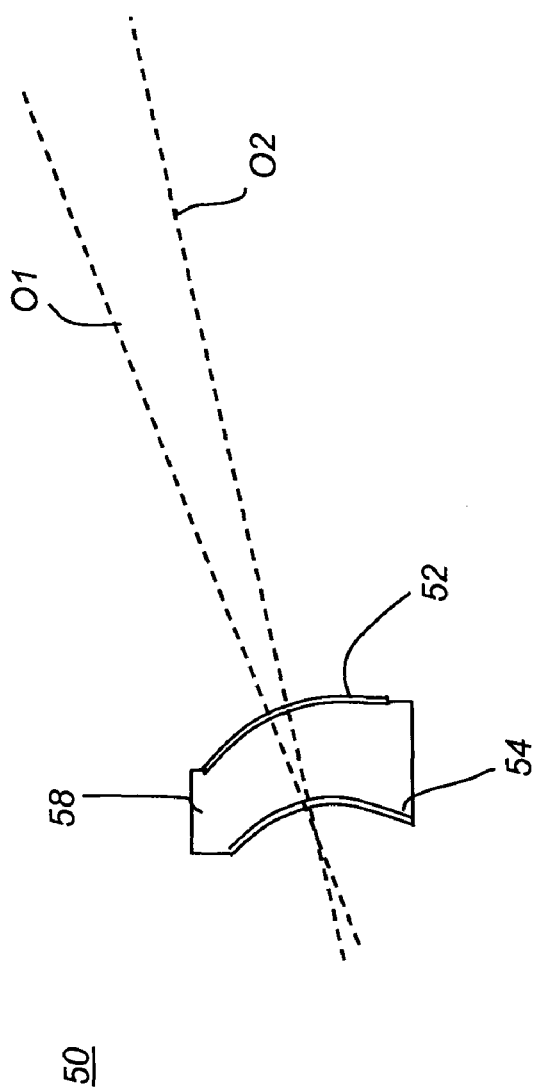

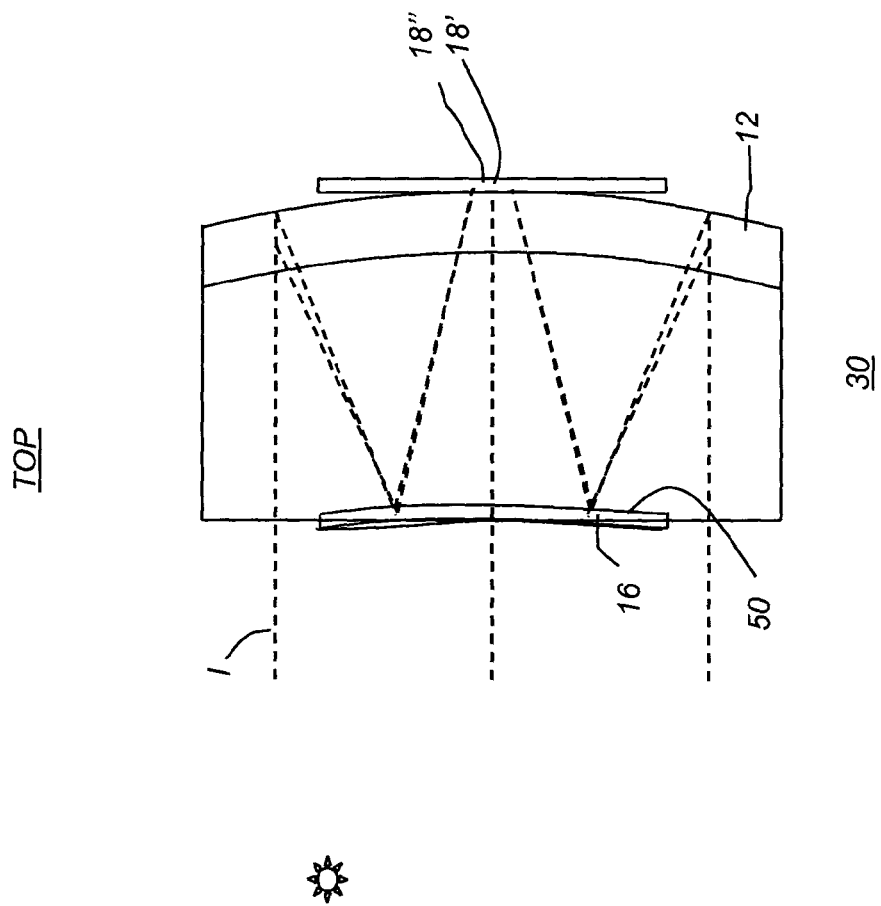

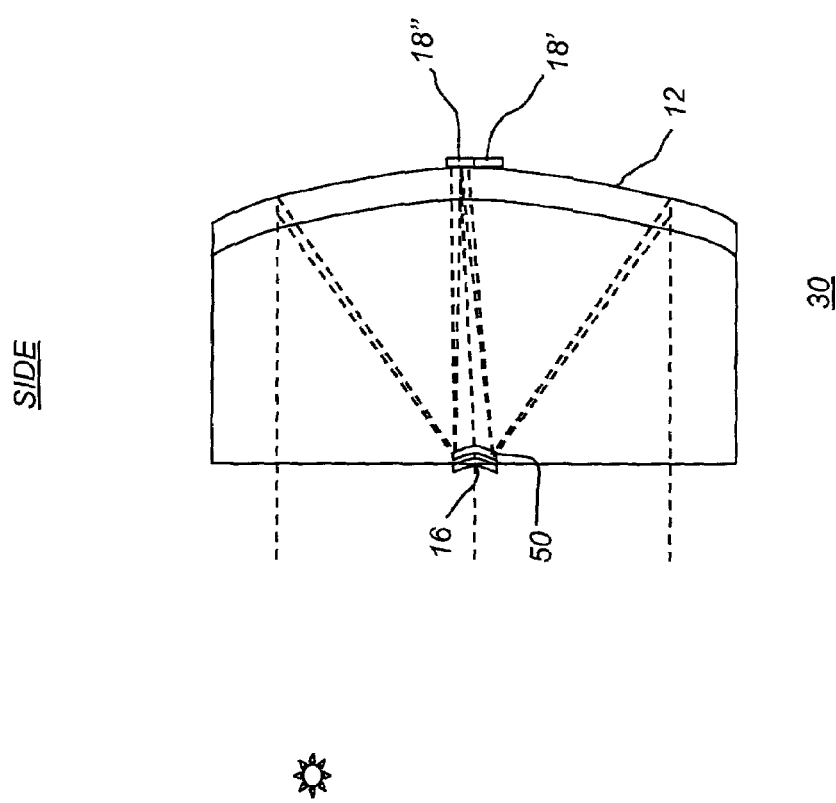

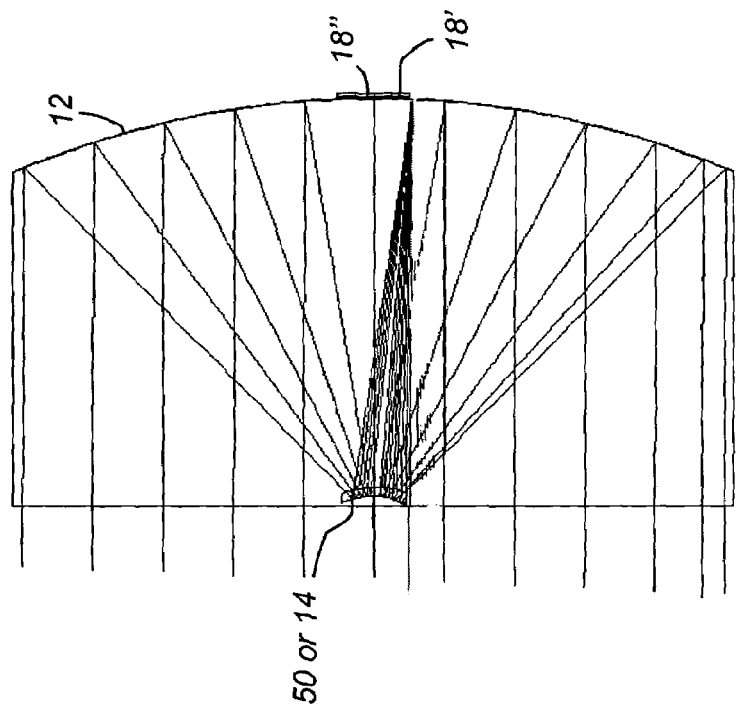
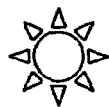
FIGURE 14

METHOD AND APPARATUS FOR CONCENTRATING LIGHT

CROSS-REFERENCE TO RELATED APPLICATIONS

This application claims the benefit of U.S. Provisional Application Ser. No. 60/751,810 filed Dec. 19, 2005 entitled "Method and Apparatus for Concentrating Light".

STATEMENT REGARDING FEDERALLY SPONSORED RESEARCH OR DEVELOPMENT

This invention was made with government support under agreement w911nf-05-9-0005 awarded by the government. The government has certain rights in the invention.

FIELD OF THE INVENTION

This invention generally relates to apparatus for light collection and more particularly relates to an apparatus that collects light, separates light according to spectral content, and concentrates the separated light onto two or more receivers.

BACKGROUND OF THE INVENTION

Efficient collection and concentration of radiant energy is useful in a number of applications and is of particular value for apparatus that convert solar energy to electrical energy. Concentrator solar cells make it possible to obtain a significant amount of the sun's energy and concentrate that energy as heat or for generation of direct current from a photovoltaic receiver.

Large-scale light concentrators for obtaining solar energy typically include a set of opposed, curved mirrors, arranged as an optical system for concentrating light onto a receiver that is positioned at a focal point. As just a few examples, U.S. Pat. No. 5,979,438 entitled "Sunlight Collecting System" to Nakamura and U.S. Pat. No. 5,005,958 entitled "High Flux Solar Energy Transformation" to Winston et al. both describe large-scale solar energy systems using sets of opposed primary and secondary mirrors. As a more recent development for providing more compact collection apparatus, planar concentrators have been introduced, such as the solution described in the article entitled "Planar Concentrators Near the Etendue Limit" by Roland Winston and Jeffrey M. Gordon in *Optics Letters*, Vol. 30 no. 19, pp. 2617-2619. Planar concentrators employ primary and secondary curved mirrors, separated by a dielectric optical material, for providing high light flux concentration.

Some types of solar energy systems operate by converting light energy to heat. In various types of flat plate collectors and solar concentrators, concentrated sunlight heats a fluid traveling through the solar cell to high temperatures for electrical power generation. An alternative type of solar conversion mechanism, more adaptable for use in thin panels and more compact devices, uses photovoltaic (PV) materials to convert sunlight directly into electrical energy. Photovoltaic materials may be formed from various types of silicon and other semiconductor materials and are manufactured using semiconductor fabrication techniques. Photovoltaic components are provided by a number of manufacturers, such as Emcore Photovoltaics, Albuquerque, N. Mex., for example. While silicon is less expensive, higher performance photovoltaic materials are alloys made from elements such as aluminum, gallium, and indium, along with elements such as nitrogen and arsenic.

As is well known, sunlight contains broadly distributed spectral content, ranging from ultraviolet (UV), through visible, and infrared (IR) wavelengths, each wavelength having an associated energy level, typically expressed in terms of electron-volts (eV). Not surprisingly, due to differing band-gap characteristics between materials, the response of any one particular photovoltaic material depends upon the incident wavelength. Photons having an energy level below the band gap of a material slip through. For example, red light photons (nominally around 1.9 eV) are not absorbed by high band-gap semiconductors. Meanwhile, photons having an energy level higher than the band gap for a material are absorbed. For example, the energy from violet light photons (nominally around 3 eV) is wasted as heat in a low band-gap semiconductor.

One strategy for obtaining higher efficiencies from photovoltaic materials is to form a stacked photovoltaic cell, also sometimes termed a multijunction photovoltaic device. These devices are formed by stacking multiple photovoltaic cells on top of each other. With such a design, each successive photovoltaic cell in the stack, with respect to the incident light source, has a lower band-gap energy. In a simple stacked photovoltaic device, for example, an upper photovoltaic cell, consisting of gallium arsenide (GaAs), captures the higher energy of blue light. A second cell, of gallium antimonide (GaSb), converts the lower energy infrared light into electricity. One example of a stacked photovoltaic device is given in U.S. Pat. No. 6,835,888 entitled "Stacked Photovoltaic Device" to Sano et al.

While stacked photovoltaics can provide some measure of improvement in overall efficiency, these multilayered devices are costly to fabricate. There can also be restrictions on the types of materials that can be stacked together, making it doubtful that such an approach will prove economical for a broad range of applications. Another approach is to separate the light according to wavelength into two or more spectral portions, and concentrate each portion onto an appropriate photovoltaic device. With this approach, photovoltaic device fabrication is simpler, less costly, and a wider variety of semiconductors can be considered for use. This type of solution requires supporting optics for both separating light into suitable spectral components and concentrating each spectral component onto its corresponding photovoltaic surface.

One proposed solution for simultaneously separating and concentrating light at sufficient intensity is described in a paper entitled "New Cassegrainian PV Module using Dichroic Secondary and Multijunction Solar Cells" presented at an International Conference on Solar Concentration for the Generation of Electricity or Hydrogen in May, 2005 by L. Fraas, J. Avery, H. Huang, and E. Shifman. In the module described, a curved primary mirror collects light and directs this light toward a dichroic hyperbolic secondary mirror, near the focal plane of the primary mirror. IR light is concentrated at a first photovoltaic receiver near the focal point of the primary mirror. The secondary mirror redirects near-visible light to a second photovoltaic receiver positioned near a vertex of the primary mirror. In this way, each photovoltaic receiver obtains the light energy for which it is optimized, increasing the overall efficiency of the solar cell system.

While the approach shown in the Fraas et al. paper advantageously provides spectral separation and concentrates light using the same set of optical components, there are some significant limitations to the solution that it presents. As one problem, the apparatus described by Fraas et al. has a limited field of view of the sky because it has a high concentration in each axis due to its rotational symmetry. Another problem relates to the wide bandwidths of visible light provided to a single photovoltaic receiver. With many types of photovoltaic materials commonly used for visible tight, an appreciable amount of the light energy would still be wasted using such an approach.

Conventional approaches have provided only a limited number of solutions for achieving, at the same time, both spectral separation and high light flux concentration of each spectral component. These two goals are somewhat in conflict, and many conventional approaches to the problem of spectral separation would be difficult to implement in a compact optical system that must also provide high light flux concentration using a small number of components. Thus, it is recognized that there is a need for a photovoltaic cell that simultaneously provides both spectral separation and light concentration, that can be readily scaled for use in a thin panel design, that provides increased efficiency over conventional photovoltaic solutions, and that can operate with a substantial field of view in at least one axis along the traversal path of the sun's changing position across the sky.

SUMMARY OF THE INVENTION

It is an object of the present invention to advance the art of light collection and spectral separation. With this object in mind, the present invention provides an apparatus for obtaining radiant energy comprising:
a) first and second photovoltaic receivers;
b) a primary curved reflective surface disposed to reflect incident polychromatic radiation toward a first focal plane; and
c) a spectral separator disposed between the first focal plane and the primary curved reflective surface, the spectral separator comprising:
  (i) a dichroic separating surface, convex with respect to the incident reflected polychromatic radiation and treated to reflect a first spectral band toward the first photovoltaic receiver and to transmit reflected polychromatic radiation outside the first spectral band;
  (ii) a curved separator reflective surface, convex with respect to the light transmitted through the dichroic separating surface and treated to reflect at least a portion of the light transmitted through the dichroic separating surface toward the second photovoltaic receiver.

In another embodiment, the present invention provides an apparatus for obtaining radiant energy comprising:
a) a three-dimensional body of a substantially transparent material having an input face for accepting an incident polychromatic radiation;
b) a primary curved reflective surface disposed to reflect the polychromatic radiation toward a first focal plane; and
c) a spectral separator disposed between the first focal plane and the primary curved reflective surface, the spectral separator comprising:
  (i) a dichroic separating surface, convex with respect to the incident reflected polychromatic radiation and treated to reflect a first spectral band toward a first photovoltaic receiver and to transmit reflected polychromatic radiation outside the first spectral band;
  (ii) a curved separator reflective surface, convex with respect to the light transmitted through the dichroic separating surface and treated to reflect at least a portion of the light transmitted through the dichroic separating surface toward a second photovoltaic receiver.

From another aspect, the present invention provides an apparatus for obtaining radiant energy comprising:
a) a dispersion element for conditioning incident polychromatic radiation to obtain a dispersed polychromatic radiation;
b) a primary curved reflective surface disposed to reflect the dispersed polychromatic radiation toward a first focal plane;
c) a secondary curved reflective surface disposed before the first focal plane and convex with respect to the incident reflected dispersed polychromatic radiation, wherein the secondary curved reflective surface is treated to reflect at least a portion of the dispersed polychromatic radiation toward a second focal plane;
d) a first photovoltaic receiver disposed near the second focal plane for receiving a first spectral band of the dispersed polychromatic radiation reflected from the secondary curved reflective surface; and
e) a second photovoltaic receiver disposed near the second focal plane for receiving a second spectral band of the dispersed polychromatic radiation reflected from the secondary curved reflective surface.

From yet another aspect, the present invention provides an apparatus for obtaining radiant energy comprising:
a) a dispersion element for conditioning incident polychromatic radiation to obtain a dispersed polychromatic radiation;
b) a primary curved reflective surface disposed to reflect the dispersed polychromatic radiation toward a first focal plane;
c) a secondary curved reflective surface disposed before the first focal plane and convex with respect to the incident reflected dispersed polychromatic radiation, wherein the secondary curved reflective surface is treated to transmit a first spectral band and to reflect dispersed polychromatic radiation outside the first spectral band toward a second focal plane;
d) a first photovoltaic receiver disposed near the first focal plane for receiving the first spectral band;
e) a second photovoltaic receiver disposed near the second focal plane for receiving a second spectral band of the dispersed polychromatic radiation reflected from the secondary curved reflective surface; and
f) a third photovoltaic receiver disposed near the second focal plane for receiving a third spectral band of the dispersed polychromatic radiation reflected from the secondary curved reflective surface.

It is a feature of the present invention that it provides both spectral separation of light into at least two spectral bands and concentration of each separated spectral band onto a receiver.

It is an advantage of the present invention that it provides a mechanism capable of increased efficiency for concentrating radiant energy onto a photoreceiver.

These and other objects, features, and advantages of the present invention will become apparent to those skilled in the art upon reading the following detailed description in conjunction with the drawings, wherein there is shown and described an illustrative embodiment of the invention.

BRIEF DESCRIPTION OF THE DRAWINGS

FIG. 8 is a cross-sectional diagram of an apparatus for concentrating radiant energy using a dichroic spectral separator.

FIGS. 11A and 11B are cross-sectional diagrams showing the behavior and composition of a spectral separator as used in the embodiments of FIGS. 8 and 9.

FIGS. 12A and 12B are top and side views, respectively, of the light concentrator of the present invention in a toric embodiment.

FIG. 14 is a cross-sectional diagram showing light handling with improper orientation of the light concentrator.

DETAILED DESCRIPTION OF THE INVENTION

The present invention provides a light concentrator providing both enhanced spectral separation and a high degree of light flux concentration, exceeding the capabilities of earlier approaches. The light concentrator of the present invention can be used as an optical component of a photovoltaic cell, embodied either as a discrete cell or as part of a photovoltaic cell array.

The figures referenced in this description illustrate the general concepts and key structures and components of the apparatus of the present invention. These figures are not drawn to scale and may exaggerate dimensions and relative placement of components for the sake of clarity. The spectral bands described herein are given by way of example and not of limitation.

Figure 1:
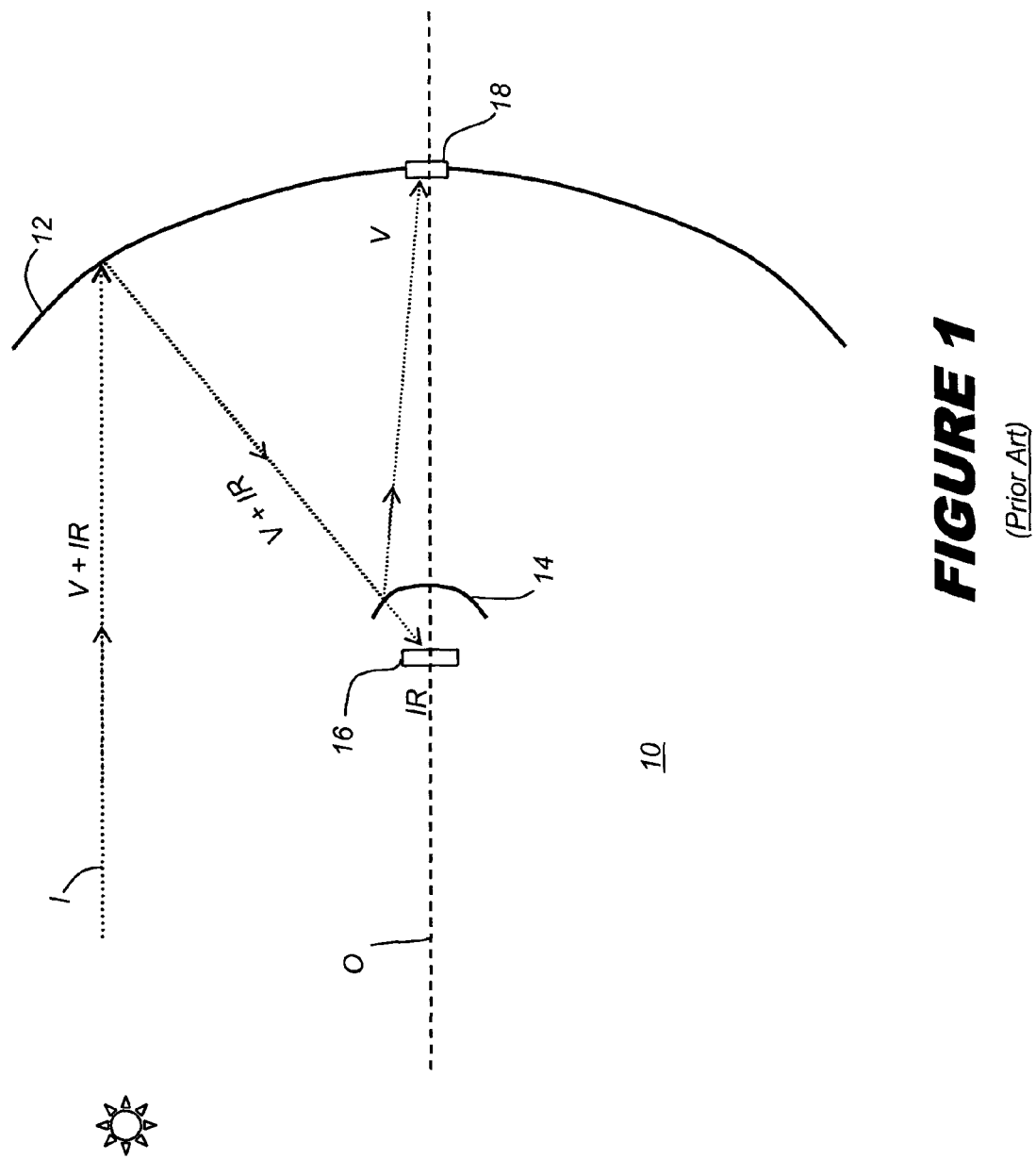
FIG. 1 is a schematic block diagram showing a conventional dual-mirror photovoltaic module according to the cassegrain model.

It is instructive to compare the approach of the present invention for light flux concentration and spectral separation with approaches that have been conventionally followed. FIG. 1 is a simplified side view block diagram showing the basic operation of a dual-mirror photovoltaic module 10 such as that described in the Fraas et al. paper described earlier in the background section. There are, in effect, two optical systems with this arrangement, each having a focal plane. Sunlight or other radiation that is highly polychromatic and contains visible wavelengths as well as infrared and ultraviolet wavelengths is incident as incident light I upon a primary curved reflective surface 12, such as a parabolic mirror, and reflected toward a secondary curved reflective surface 14 that lies near the focal plane of the first optical system comprised of the primary curved reflective surface 12 and secondary curved reflective surface 14, with transmission through curved reflective surface 14. The secondary curved reflective surface 14 is positioned at a location that is before this focal plane, relative to the path of the reflected light from primary curved reflective surface 12. Secondary curved reflective surface 14 may be a hyperbolic mirror, for example, conditioned or treated for operation using a dichroic coating that reflects visible wavelengths and transmits IR light. The IR light transmits through secondary curved reflective surface 14 to an IR PV receiver 16, located as near as possible to the focal plane of the optical system comprised of the primary curved surface 12 and the transmissive portion of curved surface 14. Visible light V, on the other hand, is directed through the second optical system, reflected back toward a visible PV receiver 18 that is at a second focal plane, positioned near a vertex of primary curved reflective surface 12. This second focal plane is the focal plane of the optical system comprised of the primary curved surface 12 and secondary curved reflective surface 14, with reflection from curved reflective surface 14. With this arrangement in which secondary curved reflective surface 14 effectively channels light to either of two optical systems, visible and IR light are both separated and concentrated onto their respective PV receivers 16 and 18.

Figure 2:
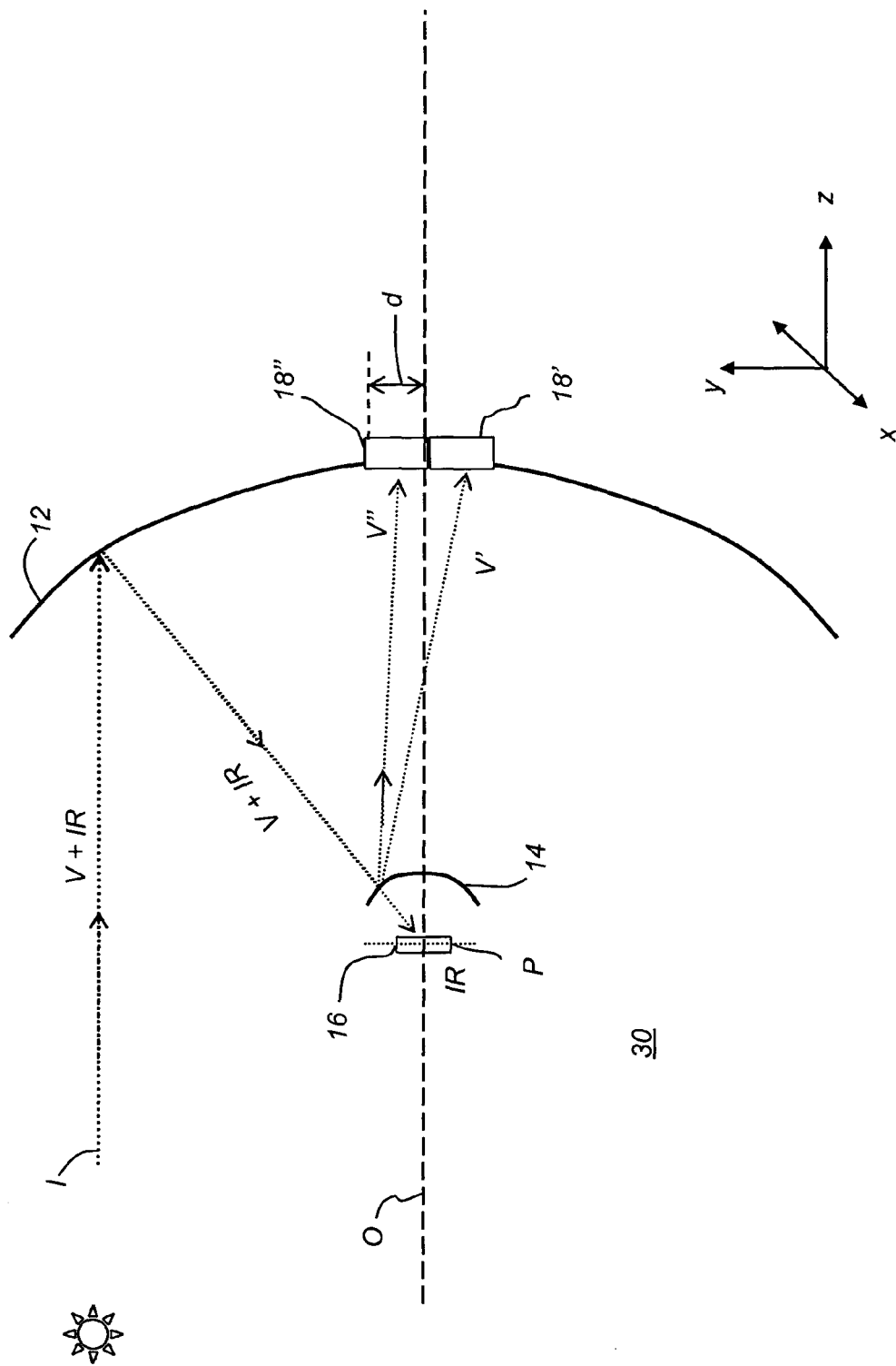
FIG. 2 is a schematic block diagram showing the basic arrangement of an apparatus for obtaining radiant energy according to the present invention.

For comparison, the simplified side view block diagram of FIG. 2 shows the approach generally used for a light concentrator 30 in the present invention. Here again, the IR light is directed to IR PV receiver 16 near the focal plane of the optical system comprised of the primary curved reflective surface 12 and the transmissive portion of curved reflective surface 14. This first focal plane is denoted P in FIG. 2. Again, primary curved reflective surface 12 is a generally parabolic mirror having a positive optical power. The visible light V is again reflected at secondary curved reflective surface 14 or at a related surface that is positioned before the focal plane P and is generally hyperbolic and has negative optical power. This basic "cassegranian" arrangement using opposed primary and secondary curved mirrors having positive and negative optical power respectively is familiar those skilled in the optical arts. The position of an optical axis O is shown.

The terminology "before the focal plane" is relative to the path of light reflected from primary curved reflective surface 12. That is, with reference to FIG. 2 and embodiments of the present invention based on this model arrangement, secondary curved reflective surface 14 lies between first focal plane P and primary curved reflective surface 12, but is located in the vicinity of first focal plane P, as will be recognized by those skilled in the optical design arts. For best collection of light, PV receiver 16 is placed as closely as possible to first focal plane P in an optimized embodiment of the present invention; hence, the descriptive phrase "near the focal plane" is used for the position of PV receiver 16. Thus, as will be recognized by those skilled in the optical design arts, some latitude must be allowed for the phrases "near the focal plane" or "at the focal plane".

Unlike conventional cassegrain embodiments for light concentration, light concentrator 30 of the present invention also provides an added measure of spectral separation for the incident light. In light concentrator 30, the reflected light is itself spectrally separated into a spectral band of longer wavelength visible light V' directed to visible PV receiver 18' and another spectral band of shorter wavelength visible light V" directed to visible PV receiver 18". As with the IR light directed toward the first focal plane, the separated visible light components V' and V" are concentrated onto their respective PV receivers 18' and 18" at a second focal plane. In a solar energy embodiment, the height of each of receivers 18' and 18", corresponding to dimension d that extends in the y direction in the coordinate axes arrangement shown in FIG. 2, is suitable for containing the image of the disc of the sun, in this axis, at the magnification provided by the dual-mirror optical system. The problem addressed by light concentrator 30 of the present invention is in further splitting of the received light with minimum loss and in providing suitable separation between the different spectral bands where these reach their respective PV receivers 18' and 18". In an optimization of this embodiment, each spectral band forms an image of the disc of the sun (of height d in the y direction), in this axis, on its respective receiver 18' or 18". Light concentrator 30 may be a discrete device wherein the primary and secondary curved reflective surfaces 12 and 14 are curved with rotational symmetry, or may be a cylindrical structure, having optical power along an axis in the z-y plane, extending in the x direction, but having no optical power in the x-z plane. PV receiver 16 near first focal plane P is optional for embodiments of the present invention, but offers the benefits of increased photovoltaic capacity.

Embodiments Using Prism Dispersion

Figure 3:
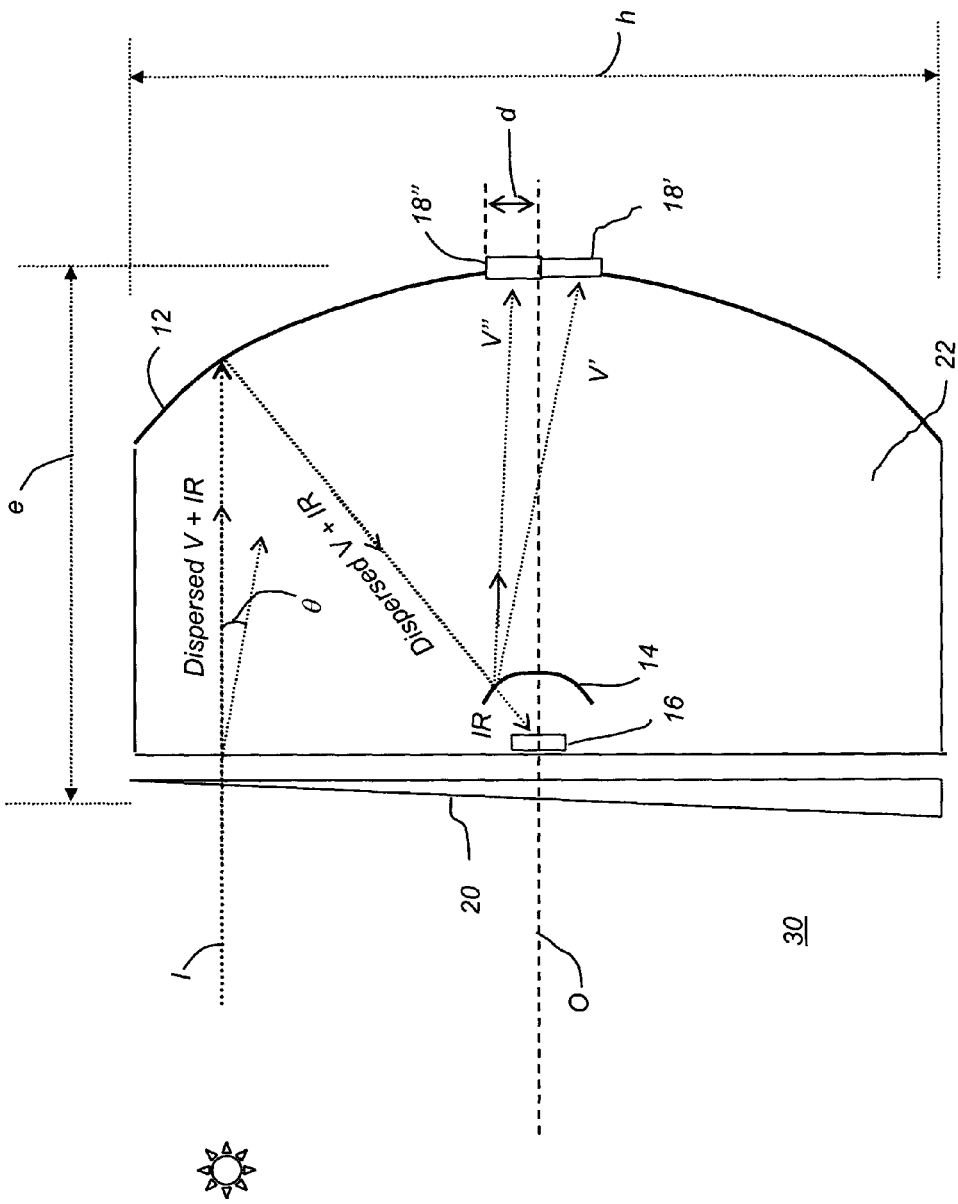
FIG. 3 is a schematic block diagram showing an apparatus using a prism for light dispersion in one embodiment.

In one embodiment, shown in FIG. 3, light concentrator 30 provides dispersion of the incident light, spreads the incident light spectrally to form multiple spectral bands, then concentrates each spectral band onto a suitable receiver. In the embodiment of FIG. 3, a prism 20 is employed as a dispersion element in light concentrator 30 to spectrally disperse a portion of the received light, providing a dispersed polychromatic radiation thereby. As is well known to those skilled in the optical arts, the amount of refraction varies with wavelength, so that the angle of refraction by a prism is a function of wavelength. Shorter wavelengths are given a higher angular redirection in prism refraction than are longer wavelengths. Thus, for example, blue light has a relatively high refraction angle; longer red and IR wavelengths, on the other hand, have relatively low refraction angles. The refractive dispersion of an optical material is the difference in refraction between two wavelengths. In most optical materials, the refractive dispersion is much higher in shorter wavelength bands than in longer wavelength bands.

FIG. 3 shows prism 20 placed in the path of incident radiation and conditioning the incident radiation to provide the needed dispersion to allow a workable separation distance between visible PV receivers 18' and 18". Incident light I is dispersed at prism 20 and reflected from primary curved surface 12. The IR light band, which undergoes very little angular change due to dispersion, again goes to IR PV receiver 16, which is optionally positioned near the focal plane of the optical system formed by primary curved reflective surface 12, through the transmissive portion of secondary curved reflective surface 14, as was described with reference to FIG. 2. The spectral band of longer visible wavelengths V' are reflected toward PV receiver 18'; shorter visible wavelengths V" are reflected toward PV receiver 18". A three-dimensional body 22 provides a medium for refraction of the incident light. Body 22 is typically made of some type of optical medium that is at least partially transparent to light such as an optical plastic, or a dielectric material such as glass, glass ceramic, quartz fused silica, or sapphire. In yet other embodiments, the dispersive, reflective, and receiver components of the FIG. 3 embodiment could be in air.

As was described with reference to FIG. 2, in order to obtain improved performance, it is useful to provide suitably separated spectral bands to long and short wavelength PV receivers 18' and 18". With reference to FIGS. 2 and 3, height d is proportional to f tan θ, where f is the effective focal length of the optical system that includes both primary and secondary curved reflective surfaces 12 and 14 and refractive body 22, and θ is the dispersion angle between the incident refracted light for two given wavelengths.

The f-number of a lens element is defined as its focal length f divided by the diameter of the lens. For forming an image of the suns disc in the plane of the page in each spectral band, light concentrator 30 is advantaged by having a focal length that is very long for a lens of its thickness. The long focal length is obtained in this design by adapting telephoto lens principles, using primary curved reflective surface 12 as a positive power element with secondary curved reflective surface 14 as a negative power element in the light path. Familiar to those skilled in the photographic arts, the telephoto lens utilizes such a telephoto group of lens elements and is characterized by a narrow angle of view, a longer-than-normal focal length, the ability to magnify images, and a relatively shallow depth of field.

The relatively large f-number of the resulting optical system of light concentrator 30 allows the use of PV receiver cells having a larger diameter than would be otherwise possible for an ordinary optical system of the same thickness. This can considerably reduce the number of PV receiver cells needed for an area (that is, fewer cells per square meter), resulting in significant cost savings.

One key advantage of light concentrator 30 design relates to the use of a dichroic surface for secondary curved reflective surface 14. In the embodiment of FIG. 3, dispersion of IR wavelengths is not needed. This would otherwise require a thick prism, a decided disadvantage for design of a thin panel device. Here, since IR wavelengths are transmitted to PV receiver 16 through secondary curved reflective surface 14, there is no need for dispersion of IR light. Instead, only a relatively thin prism 20, suitable for dispersion of visible wavelengths, is needed. This allows light concentrator 30 to be suitably scaled for use in a thin panel design. In one thin panel embodiment, for example, nominal component dimensions are as follows:

Concentrator cell height (dimension h in FIG. 3): 20 mm
Concentrator cell depth (dimension e in FIG. 3): 10 mm There is necessarily some obscuration of incident polychromatic radiation caused by the positioning of secondary curved reflective surface 14. In simple terms, secondary curved reflective surface 14 blocks some light from primary curved reflective surface 12. Optimization of the design of light concentrator 30 would take this amount of obscuration into account and dimension the height d of PV receivers 18' and 18" and the magnification factor of the optical system formed by curved reflective surfaces 12 and 14 accordingly. Increasing the focal length, for example, would effectively decrease the obscuration height. In an ideal embodiment, height d would equal half the corresponding height of the obscuration.

In one embodiment, a cylindrical design is used, so that multiple light concentrators 30 can be arranged together in an array, as described subsequently. Light concentrator 30 using the dispersion embodiment of FIG. 3 can alternately be designed as a single module for larger-scale uses.

Figure 4:
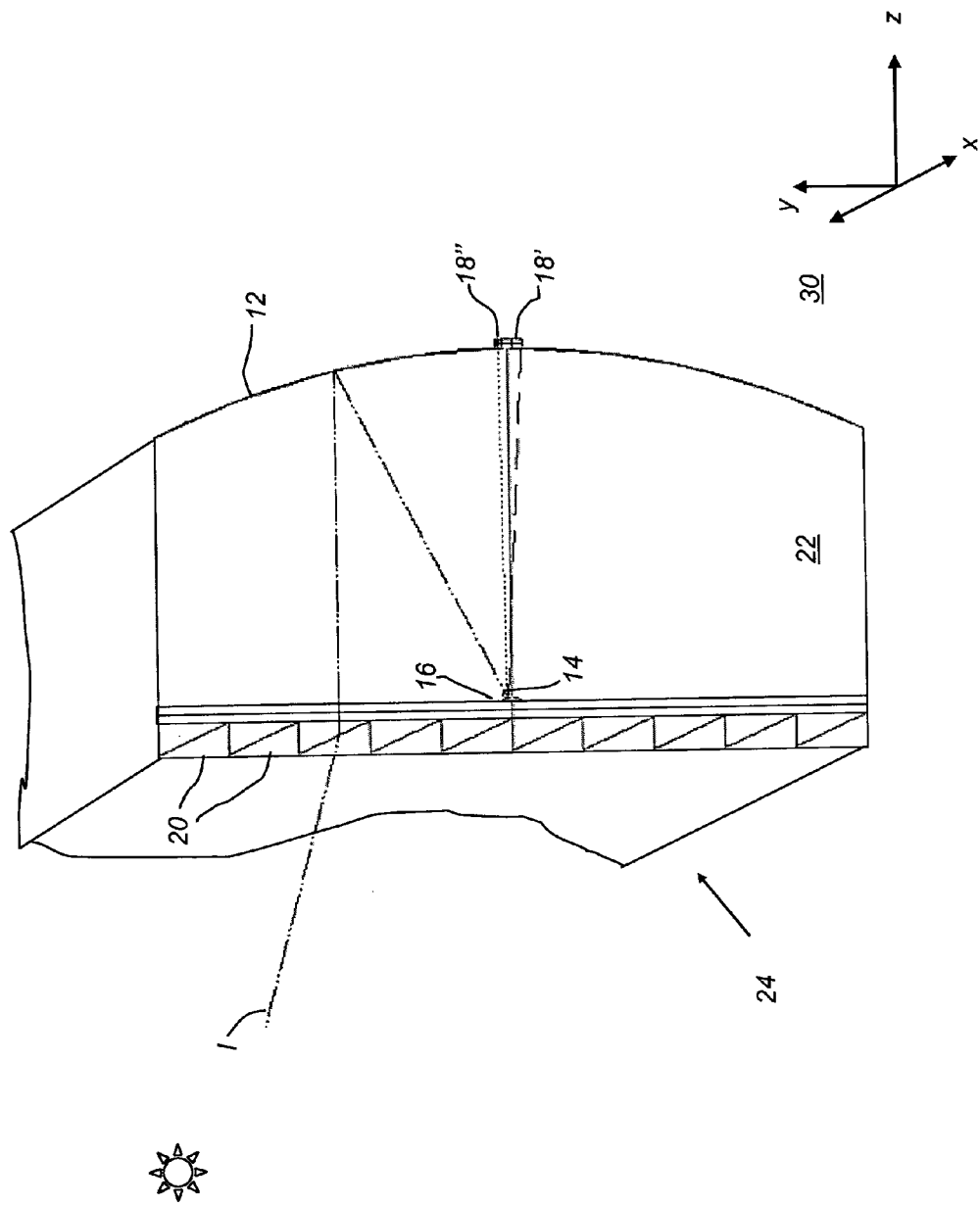
FIG. 4 is a partial perspective diagram of an apparatus for concentrating radiant energy using a prism array for spectral dispersion.
Figure 5:
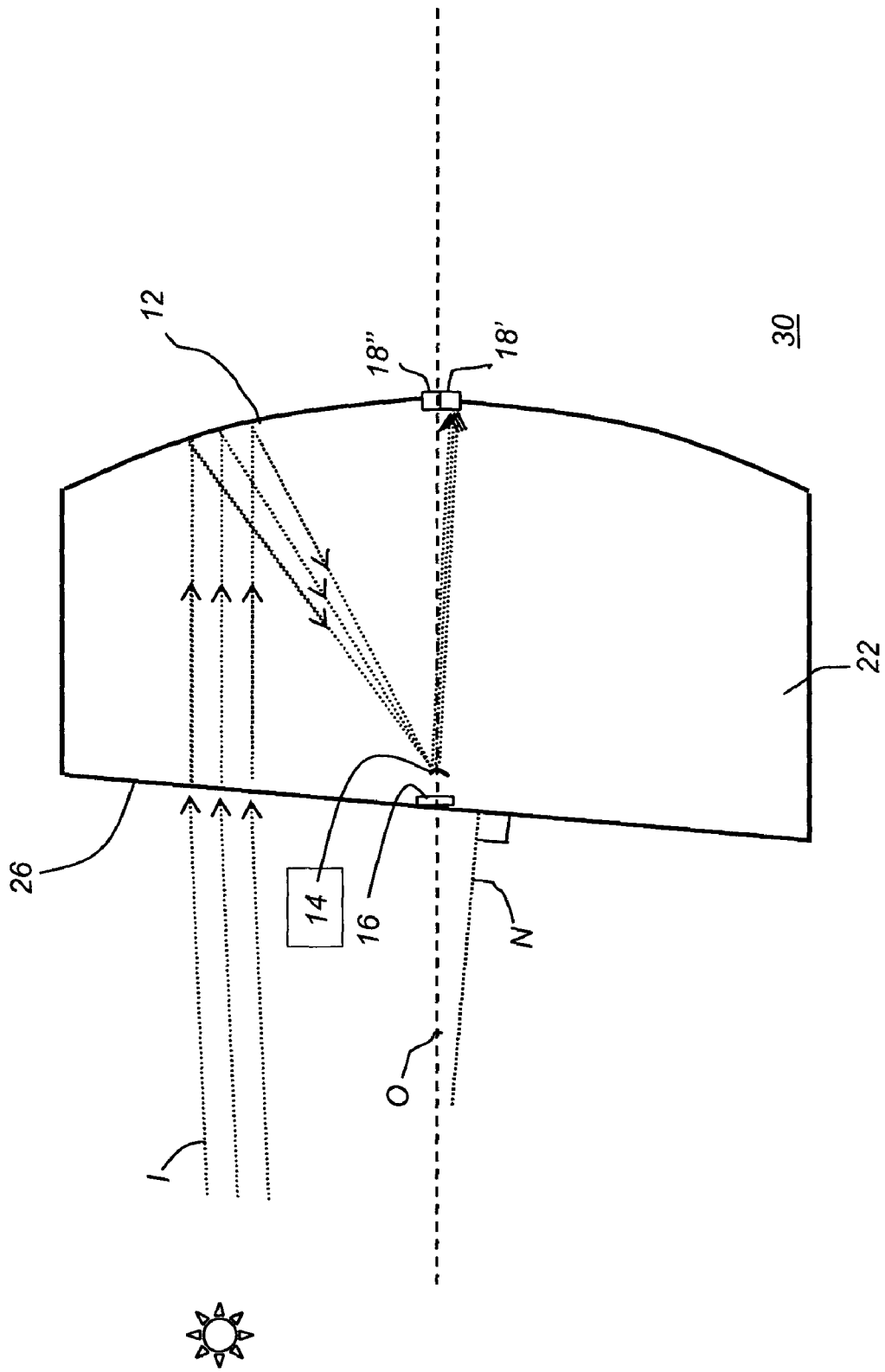
FIG. 5 is a cross-sectional diagram of an apparatus for concentrating radiant energy using a refractive body formed and oriented to provide spectral dispersion.

Prism 20 can be attached to body 22 or otherwise optically coupled in the path of incident light. As shown in the perspective view of FIG. 4, an array 24 of cylindrical prisms 20 can be formed. Array 24 could be formed onto a sheet of glass, plastic, or film, for example and positioned in front of a corresponding array of cylindrical light concentrators 30. In the coordinate system shown in FIG. 4, prisms 20 are extended in the x direction. Alternately, as shown in the embodiment of FIG. 5, body 22 of light concentrator 30 can have a prism effectively built in to the incident light surface, rather than provided as a separate component as shown in FIG. 3. That is, an input face 26 of body 22 of light concentrator 30 is sloped in order to effectively form prism 20. For this embodiment, a normal N to input face 26 is not in parallel with respect to optical axis O, which corresponds to the optical axis of primary curved reflective surface 12. Thus, planar input face 26 is disposed at a non-orthogonal angle relative to the optical axis O. With this "built-in" prism arrangement, the dielectric material itself that forms body 22 of light concentrator 30 acts as a dispersive element, thus providing the necessary refractive dispersion of the incident light. In a similar embodiment, the surface of input face 26 could be more complex, featured with a number of smaller prisms, analogous to the arrangement shown in FIG. 4. Other types of dispersive elements may alternately be used to provide the needed dispersion of incident light.

In an alternate embodiment, PV receiver 16 at first focal plane P would not be used. Instead, secondary curved reflective surface 14 would reflect the dispersed polychromatic incident light toward the two PV receivers 18' and 18" at the second focal point of the optical system formed by primary curved reflective surface 12 and secondary curved reflective surface 14. This alternate embodiment would not offer the additional photovoltaic capacity afforded by adding PV receiver 16, as shown in the embodiment of FIG. 3. However, such an alternate embodiment would provide the advantage of housing all of the photovoltaic components on the rear side of light concentrator 30, which may offer advantages for fabrication and component packaging.

Fabrication

Figure 6:
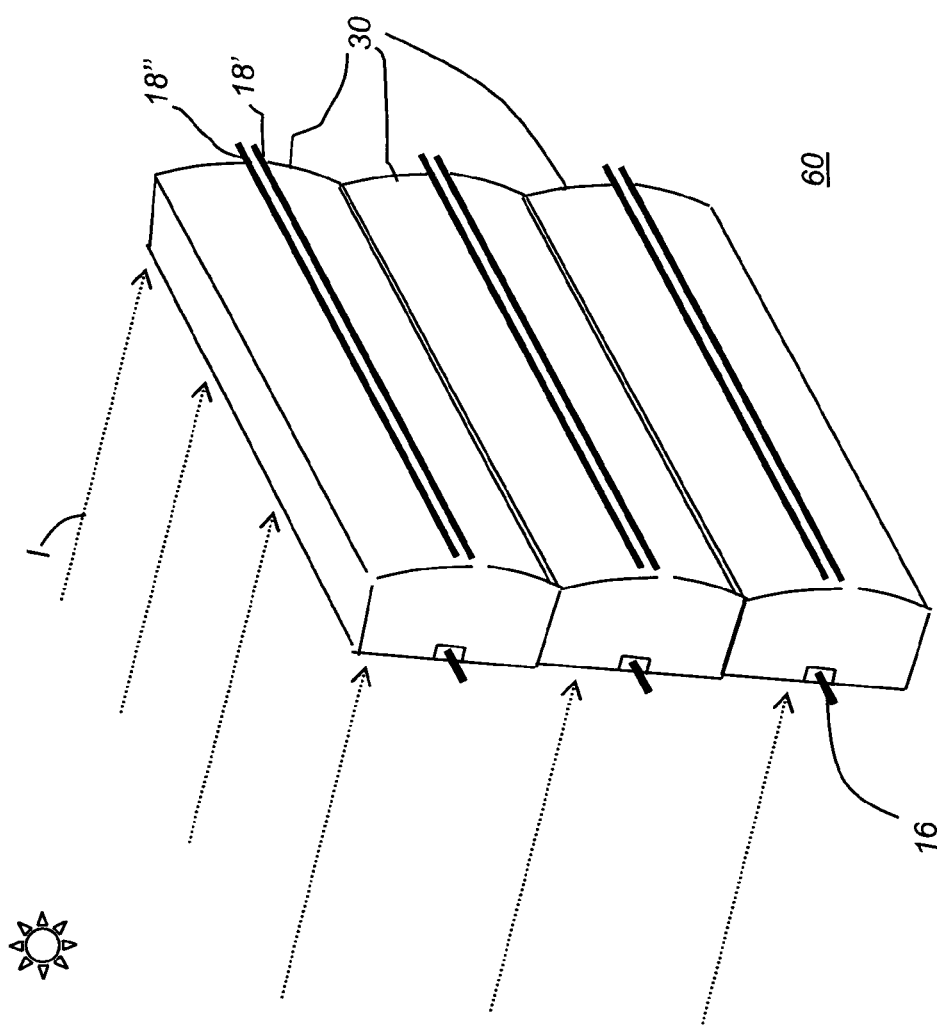
FIG. 6 is a perspective view of an array of light concentrators.

Light concentrator 30 can be formed as a discrete unit or as a cylindrical component as part of an array. In one embodiment, as shown in the perspective rear view of FIG. 6, a radiant energy concentration apparatus 60 has a plurality of light concentrators 30 assembled alongside each other in an array, each light concentrator 30 itself provided as an extended cylindrical element. Photovoltaic receivers 16, 18' and 18" are formed in linear fashion, extending continuously along the length of light concentrator 30 in one embodiment. It would be advantageous, in an array embodiment such as that shown in FIG. 6, to have each light concentrator 30 optically coupled to its neighbors, as is described subsequently.

Figure 7A:
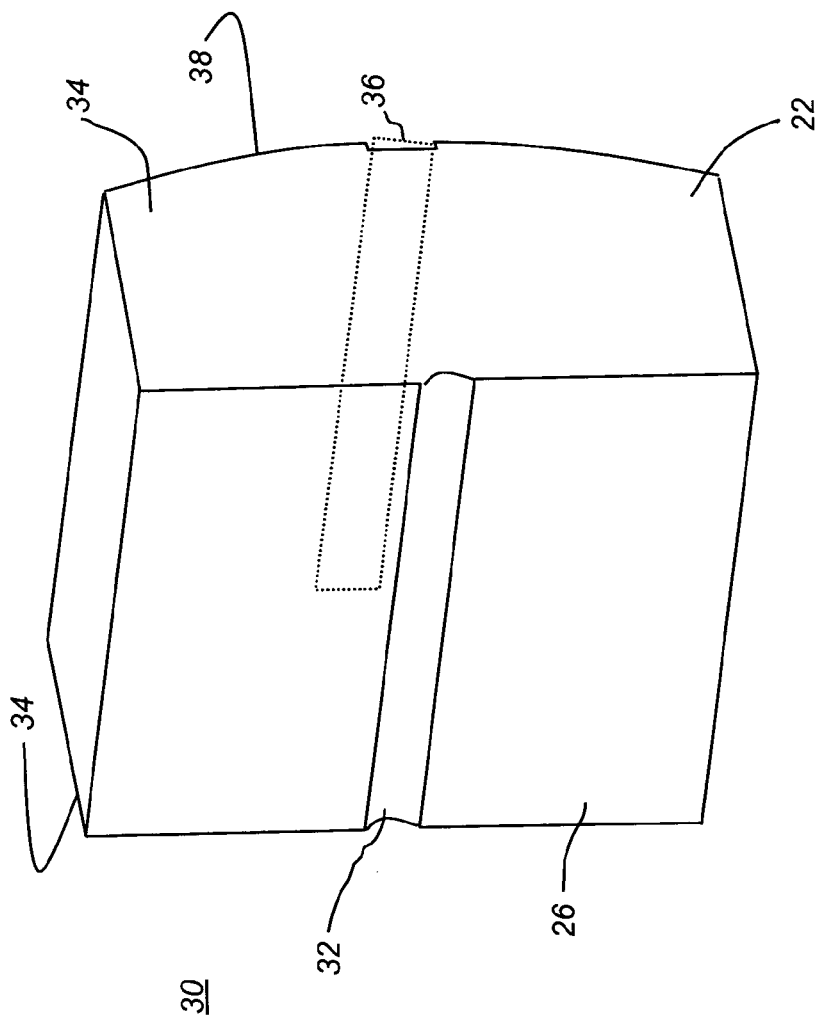
FIGS. 7A and 7B are perspective views, from input face and rear side respectively, of the structure of a light concentrator.
Figure 7B:
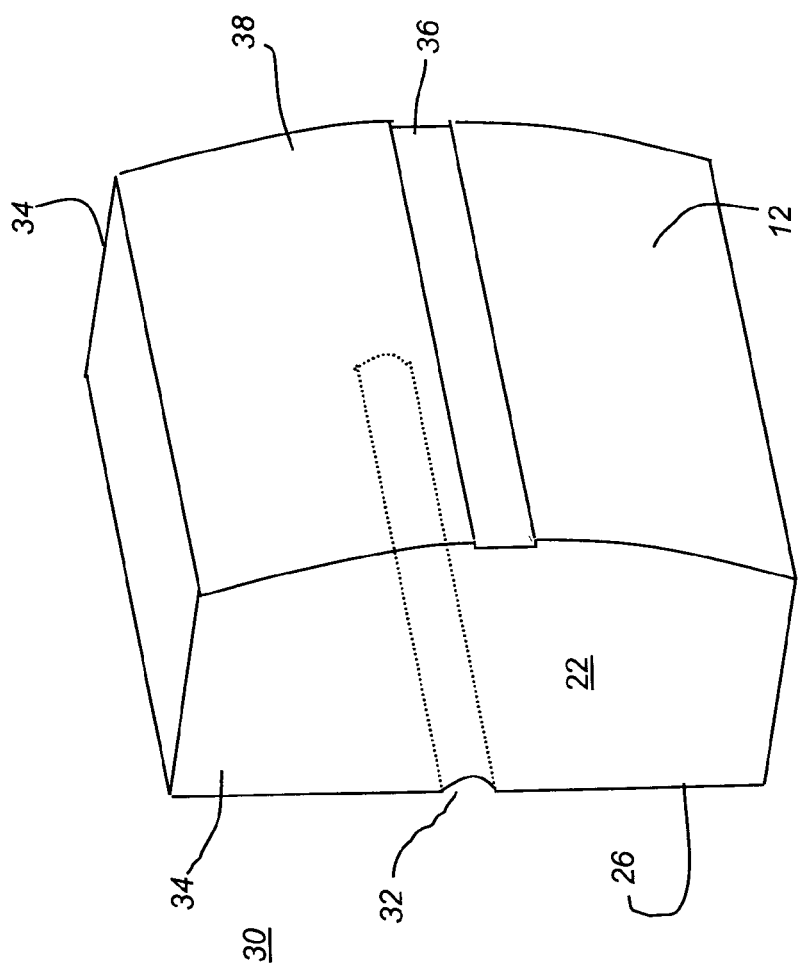

The perspective views of FIGS. 7A and 7B show, from front (input) and rear views, respectively, fabrication details of body 22 for a segment of light concentrator 30 in one embodiment. A channel 32, molded or otherwise formed on input face 26 is coated with the dichroic coating formulation of secondary curved reflective surface 14. Another channel 36 is molded or otherwise formed on a rear side 38. Portions of a rear side 38 outside of channel 36 are coated as primary curved surface 12. Sides 34 may also be reflectively coated to prevent light loss from light traveling along body 22 by total internal reflection (TIR).

Embodiments Using Dichroic Separation

In the prism embodiment of FIG. 3, secondary curved surface 14 is conditioned or treated with a dichroic coating that reflects visible light and transmits IR. Other embodiments of the present invention provide further spectral separation by manipulating spectral characteristics of the dichroic coatings and interposing an additional reflective or dichroic surface in the optical path. Referring to FIG. 8, there is shown an embodiment of light concentrator 30 using an arrangement of paired curved surfaces for spectral separation. Unlike the embodiments of FIGS. 3 through 5, refractive dispersion is not required with this embodiment. Instead, a spectral separator 50, having 2 at least partially reflective surfaces, is positioned before the first focal plane of the optical system formed by primary curved surface 12 at a location similar to that used for secondary curved reflective surface 14 in FIG. 2. In the embodiment of FIG. 8, the incoming polychromatic radiation is split into two spectral bands by spectral separator 50. In the alternate embodiment of FIG. 9, spectral separator 50 is also designed to transmit a third spectral band, such as IR radiation, to PV receiver 16 as well as to split visible light into separate bands, directing the two spectral bands of visible light to corresponding PV receivers 18' and 18".

Figure 9:
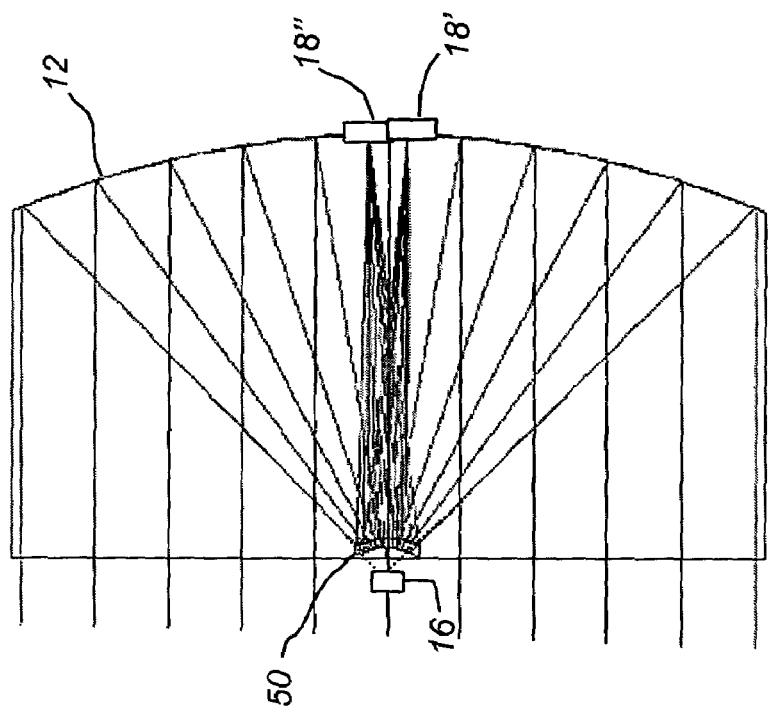
FIG. 9 is a cross-sectional diagram of an apparatus for concentrating radiant energy using a dichroic spectral separator in an alternate embodiment.

Both FIG. 8 and FIG. 9 embodiments have benefits, depending on what is needed in a specific application. The FIG. 8 embodiment provides the advantage of keeping the photovoltaic components to one side, which is a less complex arrangement and may allow more compact packaging. The FIG. 9 embodiment, on the other hand, provides the advantage of obtaining a third spectral band, thus may provide enhanced efficiency.

Figure 10A:
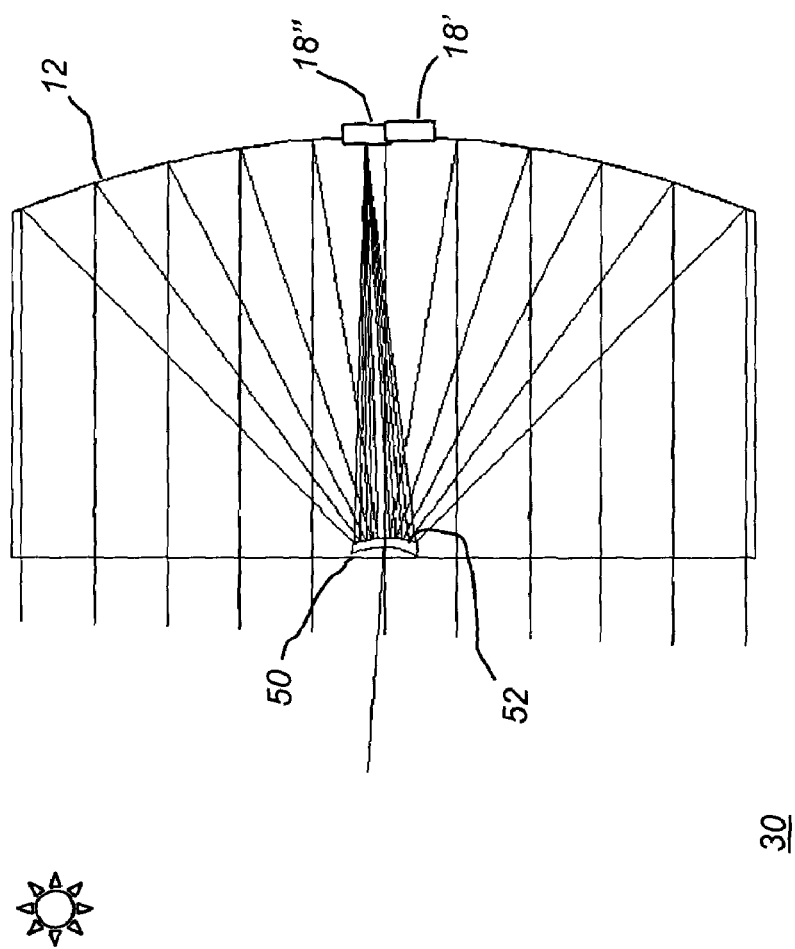
FIGS. 10A and 10B are cross-sectional diagrams showing the behavior of a spectral separator for directing light to each of two photovoltaic receivers.
Figure 10B:
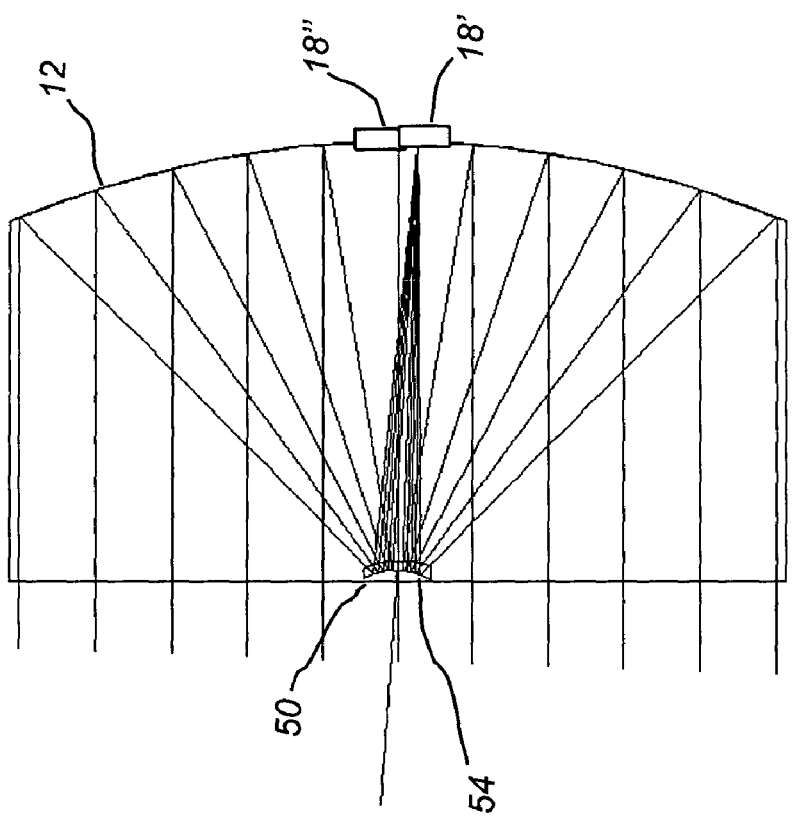

FIGS. 10A and 10B show the behavior of spectral separator 50 for each spectral band of visible light, applicable to either the two-receiver embodiment of FIG. 8 or the three-receiver embodiment of FIG. 9. In FIG. 10A, one spectral band is directed toward PV receiver 18", forming an image of the disc of the sun or other radiation source (in the power axis) thereon. Similarly, FIG. 10B shows the other spectral band directed toward PV receiver 18', again forming an image of the disc of the sun or other radiation source thereon.

Figure 11A:
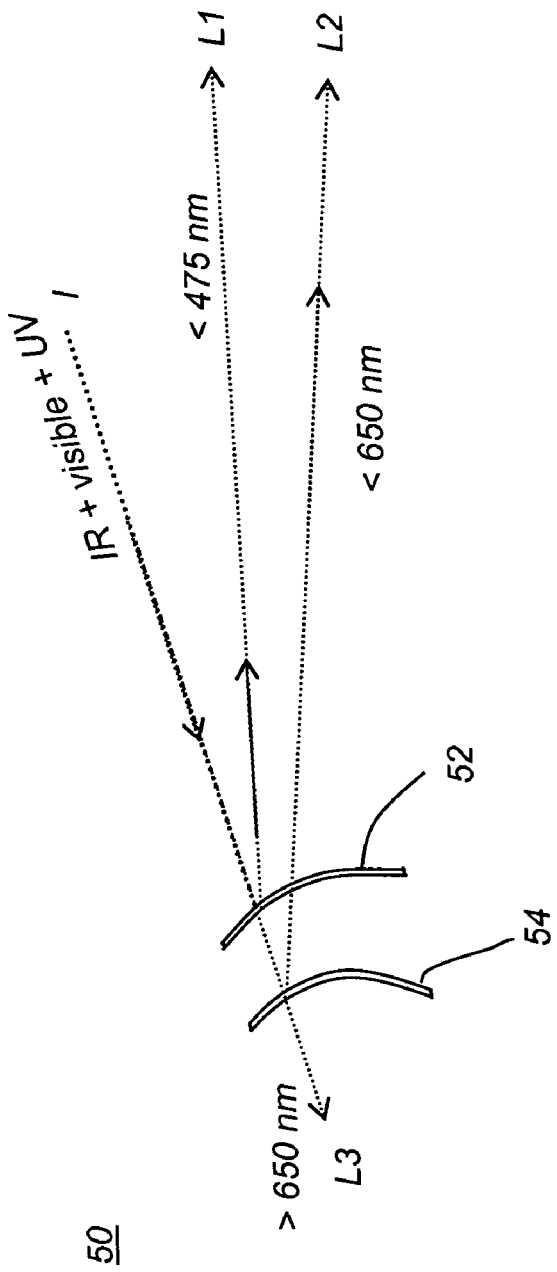

Referring to FIG. 11A, there is shown a side view of the key surfaces of spectral separator 50, enlarged from that shown in FIGS. 8, 9, 10A and 10B, again, not necessarily shown to scale. Incident light is represented by a vector I. A first curved surface 52 is a dichroic surface that is treated to reflect a first spectral band of incident polychromatic light and to transmit all remaining light outside that spectral band. The light transmitted through first curved surface 52 is then incident on a second curved surface 54, which is spaced apart from, and has curvature characteristics that differ from, first curved surface 52. In the embodiment shown, second curved surface 52 is similarly a dichroic surface that is treated to reflect a second spectral band and to transmit all remaining light outside that spectral band. Thus, the light transmitted through both curved surfaces 52 and 54 is light outside the first and second spectral bands that are reflected by first and second curved surfaces 52 and 54, respectively.

In one embodiment, for example, first curved surface 52 is coated to reflect light in the blue and ultraviolet regions, generally light having wavelengths shorter than about 475 nm, represented as a vector L1 in FIG. 11A. Other visible and infrared light is transmitted through first curved surface 52. Second curved surface 54 is coated to reflect visible red and shorter wavelengths, shorter than about 650 nm, represented as a vector L2 in FIG. 11A. Infrared light, generally longer than the 650 nm threshold, as represented by a vector L3 in FIG. 11A, can be directed to a suitable receiver. Values shown in FIG. 11A are given by way of example, and not of limitation.

FIG. 11B shows details of the optical arrangement of spectral separator 50 in one embodiment. First curved surface 52 has an axis of optical symmetry O1 in the plane of the cross-section view of FIGS. 11A and 11B. Second curved surface 54 has an axis of optical symmetry O2 in the plane of the cross-section view of FIGS. 11A and 11B. Notably, axes O1 and O2 are not collinear and are not in parallel. Thus, first and second curved surfaces 52 and 54 are optically decentered, so that light reflected from each surface goes to its respective PV receiver 18" or 18' as in FIG. 10A or 10B respectively. For example, curved surfaces 52 and 54 may be non-concentric arcs. Also, notably, the curvatures and conic constants of curved surfaces 52 and 54 can differ from each other.

In one embodiment, spectral separator 50 is fabricated by forming curved surfaces 52 and 54 on a body 58 of glass or other transparent optical material. It must be noted that there can be some confusion in terms as to the shape description for curved surface 54. With respect to the cross-sectional shape of body 58, as in FIG. 11B, curved surface 52 is convex, whereas curved surface 54 is considered to be concave. However, with regard to its spectral separation function and as particularly shown in FIG. 11A, curved surfaces 52 and 54 are both convex with respect to the incident polychromatic light I that is received from primary curved reflective surface 12. Thus, whether or not surface 52 is considered as concave or convex depends on whether or not spectral separator 50 is fabricated on body 58 or is formed from separate films or formed from treated surfaces embedded within a larger structure, such as within body 22 (FIGS. 7A, 7B). Where optical concentrator 30 is cylindrical, spectral separator 50 is also cylindrical, having power only along an axis in the z-y plane using the coordinate axes assignment shown in FIG. 2.

For the two-receiver embodiment of FIG. 8, second curved surface 54 need not be a dichroic surface, as was described with reference to FIG. 11A. Instead, since it is only necessary to split the light into two spectral bands for the FIG. 8 embodiment, second curved surface 54 can be a reflector other than a dichroic surface. In this case, first curved surface 52, the dichroic separating surface, operates in the same manner described with reference to FIG. 11A, reflecting one spectral band and transmitting all other radiation. Then, reflective second curved surface 54 is treated to simply reflect all incident wavelengths it has received as the second spectral band, directed toward the appropriate PV receiver 18' or 18". It should be noted that even where second curved surface 54 is used only as a reflector, a dichroic coating can be advantageous due to its relatively high efficiency.

While a cylindrical arrangement of light concentrator 30 may be preferred for some applications, there can also be advantages to alternate shapes, such as a toroidal shape. In a toroidal embodiment, there is optical power in multiple planes. FIGS. 12A and 12B show top and cross-sectional side views, respectively, of light concentrator 30 in a toroidal shape embodiment. Either the dispersive embodiment of FIG. 3 or the embodiments of FIGS. 8 and 9 that use spectral separator 50 could be adapted for a toroidal shape. As is shown in the top view of FIG. 12A, there would be some limitations to the respective lengths of PV receivers 16, 18', and 18" with a toroidal embodiment.

As noted earlier, embodiments using spectral separator 50 do not require the use of a dispersion element such as prism 20. However, it may be advantageous to combine the use of a dispersion element with spectral separator 50 in order to achieve improved spectral separation.

Orientation With Respect to the Radiation Source

In order to efficiently obtain and concentrate light from the sun or other radiation source, it is important that light concentrator 30 be properly oriented with respect to the source. With a discrete system, such as where body 22 is in the form of a rotationally symmetric device having a single optical axis, light-gathering efficiency is optimized simply by aligning its optical axis to the sun or other radiation source. With a cylindrical embodiment, however, device orientation can be more forgiving along the East-West axis. The North-South-East-West (abbreviated N, S, E, W) orientation of this component directly affects its capability for obtaining and concentrating radiant energy.

Figure 13A:
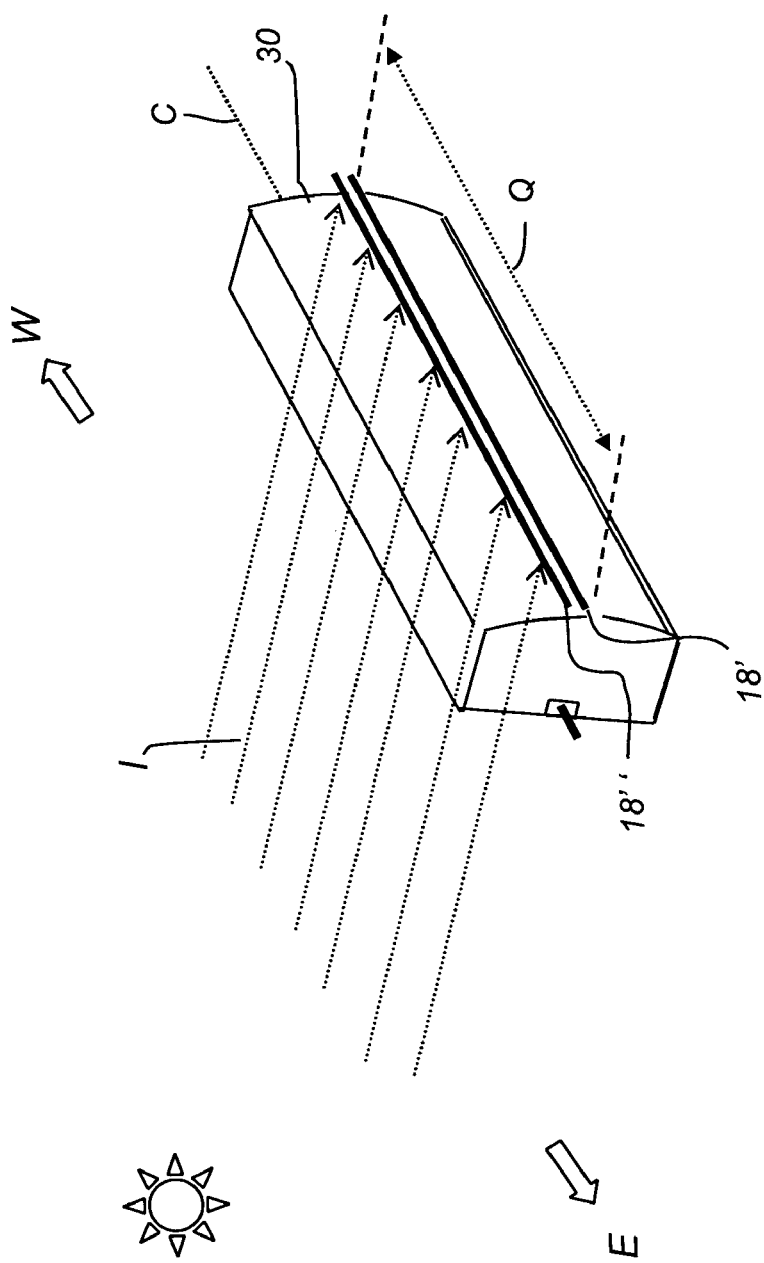
FIGS. 13A, 13B, and 13C are perspective views showing light-handling behavior of the light concentrator of the present invention in a cylindrical embodiment, for incident light at different angles.
Figure 13B:
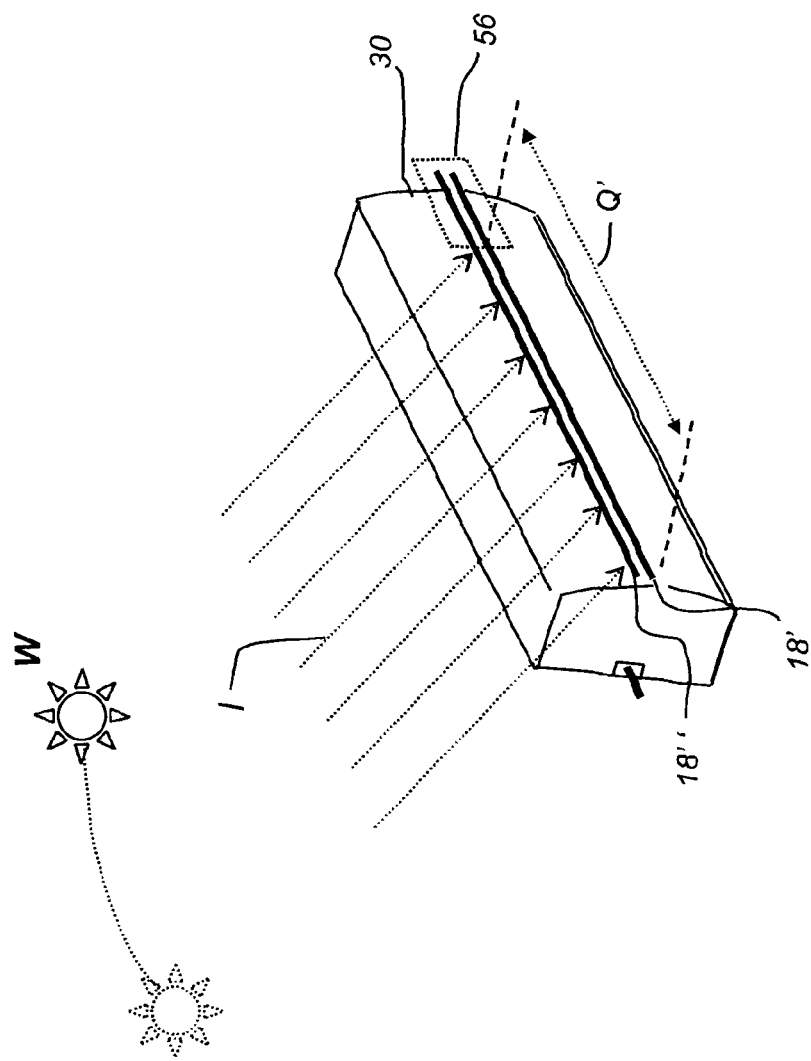
Figure 13C:
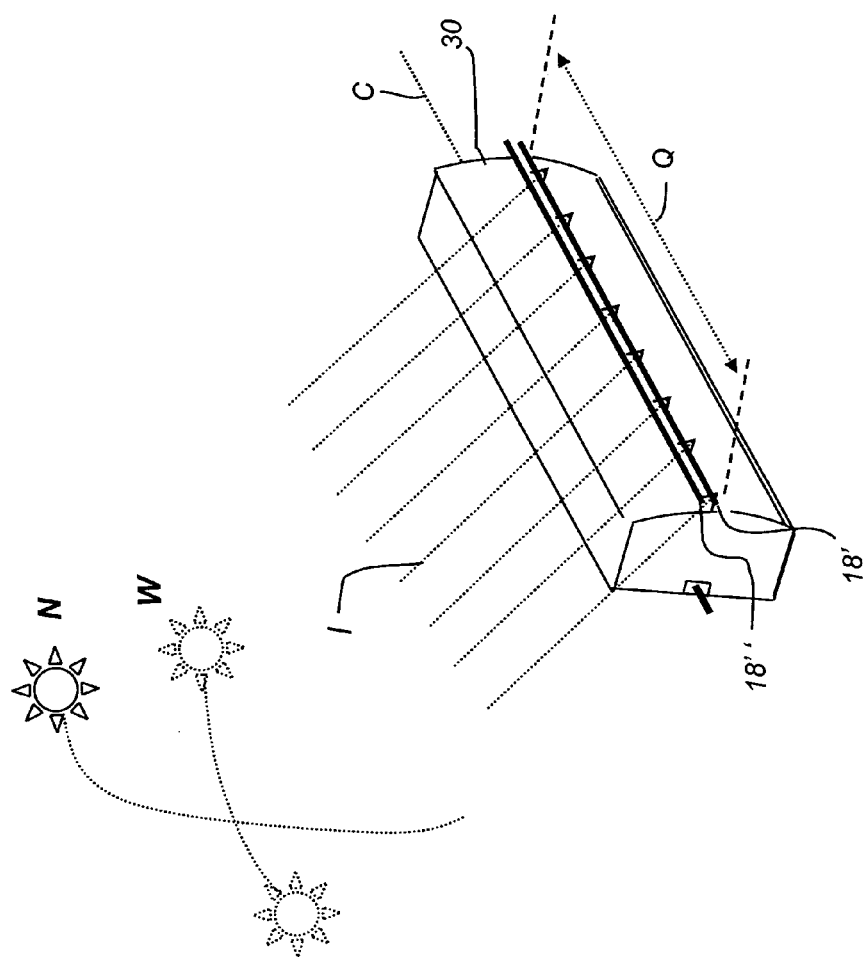

The perspective views of FIGS. 13A, 13B, and 13C show the light-gathering behavior of light concentrator 30 in a cylindrical embodiment, relative to the E-W and N-S direction of the radiation source. In FIG. 13A, the cylindrical axis C of light collector 30 is generally aligned in parallel with an E-W axis. When optimally oriented toward the sun or other radiation source, light collector 30 obtains the optimum amount of light along the full length Q of its rear PV receivers 18' and 18". FIG. 13B shows what happens when light collector 30 is no longer optimally oriented. Although, only a partial length Q' of rear PV receivers 18' and 18" receives light, a substantial amount of the light is still incident on the rear PV receivers 18' and 18" Thus, the device functions, at some level, over a fairly broad field of view in the E-W direction.

Figure 15:
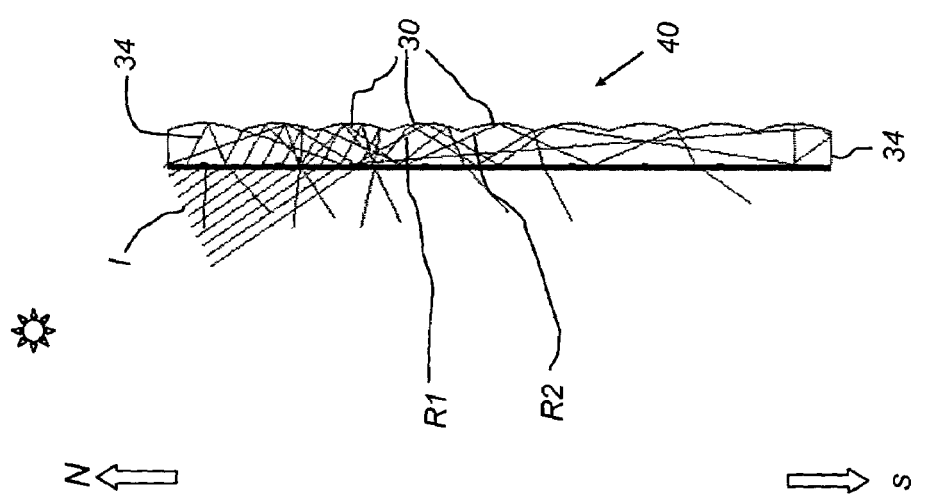
FIG. 15 is a cross-sectional side view showing stray light traveling within an array of light concentrators.

The perspective view of FIG. 13C shows the behavior of light concentrator 30 if not properly oriented relative to the N-S axis. When inaccurately tilted about its cylindrical axis C, light collector 30 may allow some "walk-off" of light in the vertical direction, as shown in the cross-sectional side view of FIG. 14, so that the proper spectral bands are not directed to their corresponding PV receivers 18' and 18". In this case, for maximized efficiency in a solar energy apparatus, it would be necessary to provide some type of angular actuation to orient light collector 30 along the N-S axis. It must be observed, however, that array embodiments, in which adjacent light collectors 30 are optically coupled, such as where adjacent light collectors 30 are optically coupled along a shared edge, can use some portion of light at oblique angles. The cross-sectional side view of FIG. 15 shows the behavior of incident light I at highly oblique angles for an array 40 of light concentrators 30. Here, adjacent light concentrators 30 are optically coupled, allowing total internal reflection (TIR) within array 40. Rays R1 and R2, for example, undergo TIR and reflection from the coated primary curved reflective surface a number of times before either encountering a receiver in one of light concentrators 30 or exiting array 40 as wasted light. Reflective sides 34 (parallel to the plane of the page) help to prevent light leakage in the direction orthogonal to the page.

Figure 16:
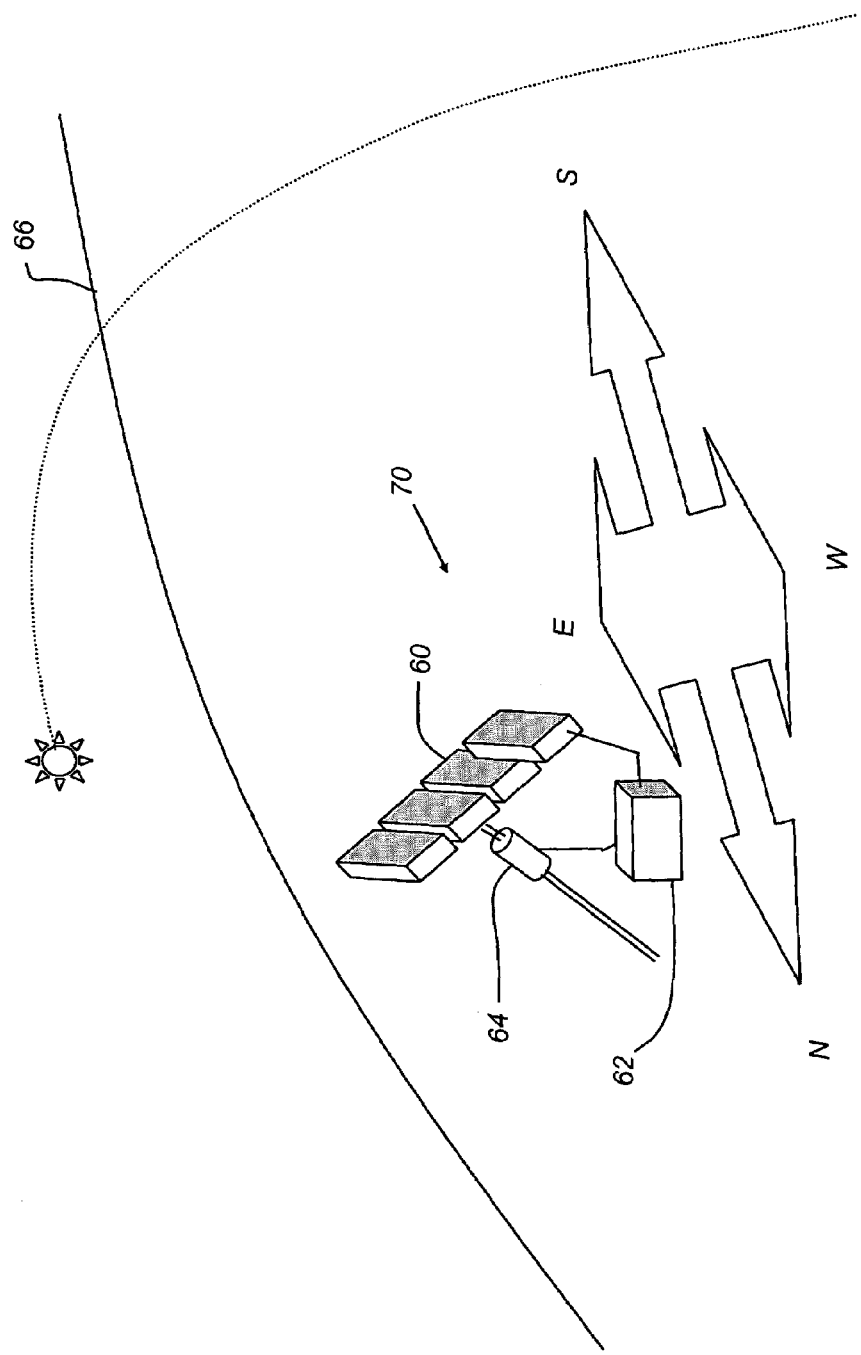
FIG. 16 is a schematic diagram in perspective, showing a solar energy apparatus with tracking to adapt to the changing position of the radiation source.

Solar tracking systems and methods are well known and can be readily adapted to use light collector 30, either in discrete or in array form. FIG. 16 shows a solar energy system 70 according to the present invention. One or more radiant energy concentration apparatus 60 is arranged and designed to track the sun. A tracking actuator 64 is controlled by a control logic processor 62 to properly orient radiant energy concentration apparatus 60 as the sun's E-W position changes relative to earth 66 throughout the day as well as to make minor adjustments necessary for proper N-S orientation. Control logic processor 62 may be a computer or a dedicated microprocessor-based control apparatus, for example. Control logic processor 62 may sense position by measuring the relative amount of electrical current obtained at a position, or by obtaining some other suitable signal. In response to this signal that is indicative of position, control logic processor 62 then provides a control signal to instruct tracking actuator 64 to make positional adjustments accordingly.

Light concentrator 30 of the present invention is advantaged over other types of radiant energy concentrator devices, providing both light concentration and spectral separation. Light concentrator 30 enables use of photovoltaic receivers having a lateral, rather than a stacked, arrangement, in which separate spectral bands are directed onto suitable photovoltaic cells, each optimized for obtaining light energy from the wavelengths in that spectral band. The apparatus of the present invention can be used to provide a discrete, modular light concentrating element or an array of light concentrators. The apparatus is scalable and can be adapted to thin panel applications or to larger scale radiant energy apparatus. The photovoltaic receivers 16, 18', and 18" can be fabricated from any suitable photovoltaic materials for the spectral bands provided, including silicon, gallium arsenide (GaAs), gallium antimonide (GaSb), and other materials.

It can be observed that the two spectral bands provided to PV receivers 18' and 18" are not sharply spectrally distinct, but will have some overlap, where each spectral band contains some of the same wavelengths. Some amount of spectral contamination would be found in both dispersive embodiments of FIGS. 3 through 5 and dichroic separator embodiments of FIGS. 8 through 10B. Dichroic coatings could be optimized to reduce spectral contamination to lower levels where desired. A dichroic coating could be provided for primary curved reflective surface 12, providing improved efficiency over many types of conventional mirror coatings.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. It is useful again to emphasize that there can be some latitude with respect to positional terms such as "near" and "before" the focal plane. Optomechanical tolerances allow some variability in precise positioning according to the principles used in this teaching of the present invention. The terms "parabolic" and "hyperbolic" are used with conventional meaning as these terms are understood and applied in practice in the optical arts, allowing some measure of latitude from perfect conformance to the corresponding geometrical shapes. For any of the embodiments shown hereinabove, spectral bands can be defined and optimized as best suits the requirements of an application.

Thus, what is provided is an apparatus that collects light from the sun or other polychromatic or spectrally distributed radiation source, separates light according to spectral content, and concentrates the separated light onto one or more receivers.

PARTS LIST

10. Photovoltaic module
12, 14. Curved surface
16, 18, 18', 18". Receiver
20. Prism
22. Body
24. Array
26. Input face
30. Light concentrator
32, 36. Channel
34. Side
38. Rearside
40. Array
50. Spectral separator
52, 54. Curved surface
56. Section
58. Body
60. Radiant energy concentration apparatus
62. Control logic processor
64. Tracking actuator
66. Earth
70. Solar energy system
C. Cylindrical axis
d. Height
e. Concentrator cell depth
h. Concentrator cell height
I. Incident light
L1, L2, L3. Light vector
N. Normal
O, O1, O2. Optical axis
P. First focal plane
Q, Q'. Length
R1, R2. Ray
N, S, E, W. North, South, East, West
x,y,z. Coordinate axes

We claim:

1. An apparatus for obtaining radiant energy comprising:
    a) first and second photovoltaic receivers;
    b) a primary curved reflective surface disposed to reflect incident polychromatic radiation toward a first focal plane; and
    c) a spectral separator disposed between the first focal plane and the primary curved reflective surface and between the source of the radiant energy and the first and second photovoltaic receivers, the spectral separator formed onto a solid body of transparent material and comprising:
        (i) a dichroic separating surface, convex with respect to the incident reflected polychromatic radiation and treated to reflect a first spectral band toward the first photovoltaic receiver and to transmit reflected polychromatic radiation outside the first spectral band;
        (ii) a curved separator reflective surface, convex with respect to the light transmitted through the dichroic separating surface and treated to reflect at least a portion of the light transmitted through the dichroic separating surface toward the second photovoltaic receiver; and wherein the dichroic separating surface is optically decentered with respect to the curved separator reflective surface.

2. The apparatus of claim 1 wherein the curved separator reflective surface is further treated to transmit light in a second spectral band.

3. The apparatus of claim 2 further comprising a third photovoltaic receiver disposed near the first focal plane for receiving light in the second spectral band.

4. The apparatus of claim 2 wherein the second spectral band includes infrared wavelengths.

5. The apparatus of claim 1 wherein the primary curved reflective surface has a dichroic coating.

6. An apparatus for obtaining radiant energy comprising at least two radiation concentrators, wherein each radiation concentrator is extended along its respective cylindrical axis, wherein each respective cylindrical axis is perpendicular to the optical axis of the incident radiant energy, and wherein each radiation concentrator comprises:
    a) a three-dimensional body of a substantially transparent material having an input face that is parallel to each respective cylindrical axis for accepting an incident polychromatic radiation;
    b) a primary curved cylindrical reflective surface formed on the body of substantially transparent material and disposed to reflect the polychromatic radiation toward a first focal plane; and
    c) a cylindrical spectral separator disposed within the body of substantially transparent material between the first focal plane and the primary curved cylindrical reflective surface, the cylindrical spectral separator comprising:
   (i) a cylindrical dichroic separating surface, convex with respect to the incident reflected polychromatic radiation and treated to reflect a first spectral band toward a first photovoltaic receiver and to transmit reflected polychromatic radiation outside the first spectral band;
   (ii) a curved cylindrical separator reflective surface, convex with respect to the light transmitted through the dichroic separating surface and treated to reflect at least a portion of the light transmitted through the dichroic separating surface toward a second photovoltaic receiver;
wherein the cylindrical spectral separator is disposed between the source of the radiant energy and the first and second photovoltaic receivers.

7. An apparatus for obtaining radiant energy comprising:
a) a three-dimensional body of a substantially transparent material having an input face for accepting an incident polychromatic radiation;
b) a primary curved cylindrical reflective surface disposed to reflect the polychromatic radiation toward a first focal plane;
c) a first photovoltaic receiver disposed near the first focal plane; and
d) a spectral separator disposed between the first photovoltaic receiver and the primary curved cylindrical reflective surface, the spectral separator comprising:
   (i) a second curved cylindrical reflective surface, convex with respect to the incident reflected polychromatic radiation and treated to reflect a first spectral band toward a second photovoltaic receiver and to transmit reflected polychromatic radiation outside the first spectral band;
   (ii) a third curved cylindrical reflective surface, convex with respect to the incident reflected polychromatic radiation and treated to reflect a second spectral band toward a third photovoltaic receiver and to transmit reflected polychromatic radiation outside the second spectral band;
wherein the first photovoltaic receiver receives polychromatic radiation outside the first and second spectral bands transmitted through the second and third curved cylindrical reflective surfaces; and wherein the second curved cylindrical reflective surface is optically decentered with respect to the third curved reflective surface.

* * * * *